United States Patent
Tangring

(10) Patent No.: US 11,121,287 B2
(45) Date of Patent: Sep. 14, 2021

(54) METHOD FOR PRODUCING AN OPTOELECTRONIC COMPONENT, AND OPTOELECTRONIC COMPONENT

(71) Applicant: OSRAM OLED GmbH, Regensburg (DE)

(72) Inventor: Ivar Tangring, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 17 days.

(21) Appl. No.: 16/627,616

(22) PCT Filed: Jul. 9, 2018

(86) PCT No.: PCT/EP2018/068550
§ 371 (c)(1),
(2) Date: Dec. 30, 2019

(87) PCT Pub. No.: WO2019/011863
PCT Pub. Date: Jan. 17, 2019

(65) Prior Publication Data
US 2020/0152838 A1    May 14, 2020

(30) Foreign Application Priority Data
Jul. 12, 2017   (DE) .......................... 102017115656.9

(51) Int. Cl.
*H01L 33/48* (2010.01)
*H01L 33/50* (2010.01)
(Continued)

(52) U.S. Cl.
CPC ............ *H01L 33/486* (2013.01); *H01L 24/32* (2013.01); *H01L 24/73* (2013.01); *H01L 33/507* (2013.01);
(Continued)

(58) Field of Classification Search
None
See application file for complete search history.

(56) References Cited

U.S. PATENT DOCUMENTS 7,038,195 B2 *   5/2006   Kida .................... H01L 31/0203
                                            250/239
7,301,176 B2 *  11/2007   Abe ........................ H01L 33/54
                                            257/100
(Continued)

FOREIGN PATENT DOCUMENTS

DE      102016121510 A1    5/2018
DE      102017111426 A1   11/2018

*Primary Examiner* — Bo B Jang
(74) *Attorney, Agent, or Firm* — Slater Matsil, LLP

(57) ABSTRACT

A method for producing an optoelectronic component and an optoelectronic component are disclosed. In an embodiment a method includes providing a carrier having a pedestal with a support surface, applying a liquid joining material with filler particles to the support surface of the pedestal and applying a radiation emitting semiconductor chip with a mounting surface, which is larger than the support surface of the pedestal to the liquid joining material such that the joining material forms a joining layer between the support surface of the pedestal and the mounting surface of the semiconductor chip and the joining material at least partially fills only a recess, which is limited by a part of the mounting surface projecting beyond the support surface.

13 Claims, 5 Drawing Sheets

(51) Int. Cl.
*H01L 33/60* (2010.01)
*H01L 33/62* (2010.01)
*H01L 23/00* (2006.01)

(52) U.S. Cl.
CPC .............. *H01L 33/60* (2013.01); *H01L 33/62* (2013.01); *H01L 2224/32258* (2013.01); *H01L 2224/73265* (2013.01); *H01L 2933/0033* (2013.01); *H01L 2933/0041* (2013.01); *H01L 2933/0091* (2013.01)

(56) References Cited

U.S. PATENT DOCUMENTS

| | | | |
|---|---|---|---|
| 7,391,153 B2 * | 6/2008 | Suehiro | H01L 33/20 |
| | | | 313/512 |
| 8,089,087 B2 | 1/2012 | Lee | |
| 8,203,218 B2 | 6/2012 | Kim | |
| 2003/0219919 A1 * | 11/2003 | Wang | H01L 33/486 |
| | | | 438/26 |
| 2005/0006755 A1 | 1/2005 | Ng et al. | |
| 2005/0067628 A1 * | 3/2005 | Kuwabara | H01L 33/60 |
| | | | 257/98 |
| 2006/0043407 A1 * | 3/2006 | Okazaki | H01L 33/60 |
| | | | 257/100 |
| 2011/0151626 A1 | 6/2011 | Lin et al. | |
| 2014/0353704 A1 | 12/2014 | Kamikawa | |
| 2015/0014720 A1 | 1/2015 | Tien | |

* cited by examiner

METHOD FOR PRODUCING AN OPTOELECTRONIC COMPONENT, AND OPTOELECTRONIC COMPONENT

This patent application is a national phase filing under section 371 of PCT/EP2018/068550, filed Jul. 9, 2018, which claims the priority of German patent application 102017115656.9, filed Jul. 12, 2017, each of which is incorporated herein by reference in its entirety.

TECHNICAL FIELD

A method for manufacturing an optoelectronic component and an optoelectronic component are given.

BACKGROUND

An optoelectronic component, for example, is described in the German Patent Application No. 10 2016 121510.

SUMMARY OF THE INVENTION

Embodiments provide a component that has an increased light extraction. Further embodiments provide a method for manufacturing an optoelectronic component with increased light extraction is to be specified.

According to an embodiment of the method, a carrier is provided with a pedestal, which has a supporting surface. A liquid joining material with filler particles is applied to the support surface of the pedestal according to an embodiment of the method. For example, the jointing material is an adhesive.

The jointing material preferentially forms a drop on the contact surface. Particularly preferably, the jointing material particularly wets only the contact surface of the pedestal, while side surfaces of the pedestal remain free of the jointing material. Particularly preferably, the contact surface is completely wetted by the jointing material.

The mounting surface of the pedestal is preferably arranged in a vertical direction at a distance from at least a part of the surface of the carrier, wherein the vertical direction is perpendicular to a main extension plane of the carrier. In other words, the pedestal protrudes from the carrier. A side wall of the pedestal is preferably perpendicular to a main extension plane of the carrier.

According to a further embodiment of the method, in a next step a radiation emitting semiconductor chip with a mounting surface that is larger than the contact surface of the pedestal is applied to the liquid joining material in such a way, for example by lowering, that the joining material forms a joining layer between the contact surface of the pedestal and the mounting surface of the semiconductor chip.

If the semiconductor chip is applied to the contact surface, the side surfaces of the pedestal, the part of the mounting surface projecting above the contact surface of the pedestal and a surface of the carrier below the semiconductor chip preferably form a recess. When applying the semiconductor chip to the contact surface, the joining material preferably fills only the recess at least partially. The remaining surface of the carrier, which is not protruded by the semiconductor chip, remains particularly preferably free of the joining material. Therefore, only the surface of the carrier below the mounting surface of the semiconductor chip is particularly preferably covered with the joining material, while the rest of the surface of the carrier remains free of the joining material.

When the semiconductor chip is applied to the liquid joining material to the contact surface of the pedestal, the joining material is partially displaced and the joining layer forms between the contact surface of the pedestal and the mounting surface of the semiconductor chip. Furthermore, a part of the displaced joining material runs over the side surfaces of the pedestal down to the bottom surface of the carrier below the semiconductor chip.

Particularly preferably, the side surfaces of the semiconductor chip are free of the joining material. In such a way the light extraction from the semiconductor chip and thus the brightness of the optoelectronic component is increased.

Particularly preferably, the semiconductor chip is applied to the contact surface by lowering in such a way that the joining material first completely wets the mounting surface of the semiconductor chip before filling the recess.

According to a further embodiment of the method, the joining material is cured, preferably after the semiconductor chip has been applied. During curing of the joining material, a material-locking connection between the contact surface of the pedestal and the mounting surface of the semiconductor chip results due to the cured joining layer. Also, the joining material in the recess, which is limited by the part of the mounting surface projecting over the contact surface, is cured, so that a mechanically stable underfill of cured joining material is created under the semiconductor chip. The underfill under the semiconductor chip improves the thermal bonding of the semiconductor chip to the carrier with advantage.

Particularly preferably, the joining layer has a thickness between 1 micrometer and 5 micrometer, inclusive the limits. Such a thin joining layer allows in particular a good thermal bonding of the semiconductor chip to the carrier. This leads to a good heat dissipation from the semiconductor chip during operation of the component.

For example, the carrier comprises a lead frame. The lead frame can be made of metal. Preferably, the surface of the lead frame is formed by silver. The lead frame can be inserted into a housing body that has a cavity. The lead frame can be freely accessible in places in the housing body. For example, the lead frame forms a bottom surface of a cavity in which the semiconductor chip is mounted. Preferably, the pedestal is part of the lead frame and therefore embodied metallic. Heat can be effectively dissipated from the semiconductor chip via the metallic pedestal with advantage.

Preferably, the radiation emitting semiconductor chip comprises an epitaxial semiconductor layer sequence with an active zone that is configured to generate electromagnetic radiation of a first wavelength range. Preferably, the active zone is configured to generate blue light. Furthermore, the semiconductor chip preferably has a substrate that is transparent to electromagnetic radiation of the active zone, such as blue light. For example, the substrate comprises sapphire or is formed from sapphire, while the epitaxial semiconductor layer sequence is based on a nitride compound semiconductor material. Nitride compound semiconductor materials are compound semiconductor materials that contain nitrogen, such as materials from the system $In_xAl_yGa_{1-x-y}N$ with $0 \leq x \leq 1$, $0 \leq y \leq 1$ und $x+y \leq 1$.

For example, the epitaxial semiconductor layer sequence is grown epitaxially on a first main surface of the substrate. The first main surface of the substrate is opposed by a second main surface, which can form a mounting surface of the semiconductor chip. Side surfaces of the substrate are preferably located between the first main surface of the substrate and the second main surface of the substrate. If the substrate is transparent to radiation from the active zone, electromagnetic radiation is preferably also emitted by the semiconductor chip during operation via the side surfaces of the substrate. Furthermore, the semiconductor chip has two electrical contacts, which are preferably arranged on a front side of the semiconductor chip, which is opposite to the mounting surface of the semiconductor chip.

For example, the joining material comprises a silicone, in which the filler particles are incorporated. The joining material can also be formed from a silicone with filler particles.

According to an embodiment, the filler particles are embodied reflective, at least for the electromagnetic radiation of the active zone. The filler particles are particularly preferably diffusely reflective, at least for the radiation of the active zone. For example, diffusely reflecting filler particles can be titanium dioxide particles. If the joining material is provided with diffusely reflecting filler particles, the cured joining material is usually also diffusely reflecting and therefore embodied white. If the underfill is reflective, the luminous efficacy of the component and thus its brightness is increased with advantage, since radiation emitted from the rear via the substrate is reflected to a radiation exit surface of the component.

Furthermore, the filler particles can also be embodied wavelength converting. The wavelength converting filler particles are preferably configured to convert electromagnetic radiation of the first wavelength range, which is generated in the active zone, into electromagnetic radiation of a second wavelength range, which is different from the first wavelength range. Particularly preferably, the wavelength converting filler particles are configured to convert blue light into red light, If the filler particles are wavelength converting, the wavelength converting filler particles contribute advantageously to the heat dissipation from the semiconductor chip. In this way, the lifetime and efficiency of the component are increased with advantage.

If the filler particles are wavelength converting, they preferably have between 0.5 micrometer and 1.5 micrometer.

If the filler particles are embodied reflective, they have preferably a diameter between 150 nanometer and 250 nanometer, inclusive the limits.

According to a further embodiment of the method, a surface of the carrier forms at least partially a bottom surface of a cavity in which the semiconductor chip is arranged. The ea is preferably filled with a casting in which phosphor particles are introduced. The phosphor particles convert radiation of the first wavelength range at least partially into radiation of a third wavelength range. The first wavelength range, the second wavelength range and the third wavelength range each are preferably different from each other. Particularly preferably, the phosphor particles convert blue light into green light.

The method described here can be used to manufacture an optoelectronic component. Features and embodiments, which are described here only in connection with the method can also be embodied in the optoelectronic component and vice versa.

According to an embodiment, the optoelectronic component comprises a carrier with a pedestal. The pedestal has a contact surface.

According to a further embodiment, the optoelectronic component comprises a radiation emitting semiconductor chip with a mounting surface, which is larger than the support surface of the pedestal. The part of the mounting surface protruding over the support surface of the pedestal limits a recess. The recess is further preferably limited by side surfaces of the pedestal and parts of a surface of the carrier beyond which the semiconductor chip protrudes. The semiconductor chip is preferably arranged in a centered manner on the support surface of the pedestal.

The semiconductor chip is preferably applied with its mounting surface to the contact surface of the pedestal by means of a joining layer. The joining layer is preferably formed from a joining material with filler particles.

Particularly preferably, the recess is at least partially filled with the cured joining material with filler particles. The cured joining material preferably forms a mechanically stable underfill under the semiconductor chip. A region of a surface of the carrier that is not protruded by the semiconductor chip is particularly preferably free of the underfill. In other words, the underfill is preferably arranged only in the recess below the semiconductor chip, while the remaining surface of the carrier is free of the underfill. Particularly preferably, the side surfaces of the semiconductor chip are also free of the joining material.

According to an embodiment of the component, the semiconductor chip is arranged in a cavity filled with a wavelength converting casting. For example, the semiconductor chip emits blue light and is provided with an underfill, which comprises wavelength converting filler particles. The wavelength converting filler particles are preferably configured to convert blue light into red light, while the phosphor particles of the casting are preferably configured to convert blue light into green light. In this case, the component preferably emits mixed-color light, which consists of unconverted blue radiation from the semiconductor chip, converted red radiation from the underfill and converted green radiation from the casting. The mixed-color light of the component preferably has a color location in the white region.

According to a further embodiment of the component, the carrier has one single pedestal. The semiconductor chip is preferably applied centrally on the support surface of the pedestal. The recess, which is formed by the part of the mounting surface of the semiconductor chip projecting over the carrier, is preferably formed completely circumferentially around the pedestal.

According to a further embodiment of the component, the pedestal has a penetration or an indentation, which is limited by the contact surface. In other words, the pedestal can be embodied as a frame that limits a penetration. It is also possible that the pedestal limits a frame-like element that limits an indentation. The frame or the frame-like element comprises the support surface on which the semiconductor chip is applied with its mounting surface. If the pedestal is embodied as a frame that limits a protrusion, the recess, which is limited by the mounting surface above the protrusion and the surface of the carrier, is preferably filled with the underfill.

According to a further embodiment of the component, the semiconductor chip has two electrical contacts on its front side. The carrier preferably comprises two pedestals, each of which is located underneath an electrical contact of the semiconductor chip. In other words, the pedestals support the semiconductor chip below the electrical contacts, while the regions between the pedestals contribute to the recess. This embodiment has the advantage that bond wires can be easily placed on the electrical contacts without tilting the semiconductor chip.

The component is based, among other things, on the idea of arranging the semiconductor chip on a metallic pedestal of a lead frame to allow good heat dissipation from the semiconductor chip during operation. At the same time, the mounting surface of the semiconductor chip is preferably larger than the contact surface of the pedestal in order to minimize the amount of radiation from the semiconductor chip that is absorbed by the metallic lead frame. The recess thus created under the semiconductor chip is preferably filled with an underfill that can be embodied reflective and/or wavelength converting. Regardless of its optical properties, the underfill improves heat dissipation from the semiconductor chip. A reflective underfill increases the brightness of the component with advantage, while a wavelength converting underfill can also increase the lifetime of the component with advantage. In addition, a wavelength converting underfill usually has the advantage that less radiation from the first wavelength range impinges on the surface of the substrate, which can contain silver, for example.

The component can be manufactured with advantage using the method described herein, in which the joining layer for the attachment of the semiconductor chip to the pedestal and the underfill are simultaneously formed from a drop of liquid joining material by lowering the semiconductor chip slowly and in a controlled manner onto the contact surface of the pedestal covered with liquid joining material. The liquid joining material may first cover the mounting surface of the semiconductor chip as completely as possible and then runs down the side surfaces of the pedestal. Furthermore, only the region below the semiconductor chip should be covered with the joining material. For this the accurate adjustment of the amount of joining material is desired.

BRIEF DESCRIPTION OF THE DRAWINGS

Further advantageous embodiments and developments of the invention result from the execution examples described in the following in connection with the Figures.

On the basis of the schematic sectional views of FIGS. 1 to 7, a method according to an execution example is explained in more detail.

On the basis of the schematic sectional views of FIGS. 8 to 11, a method according to a further execution example is explained in more detail.

Figure 12:
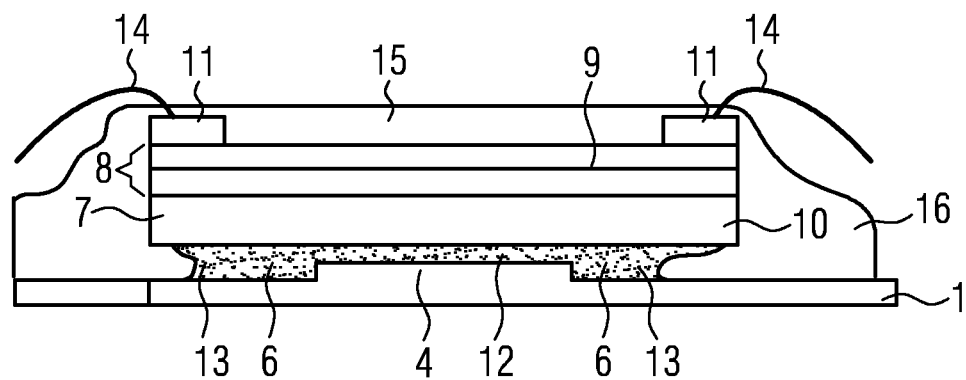
Figure 13:
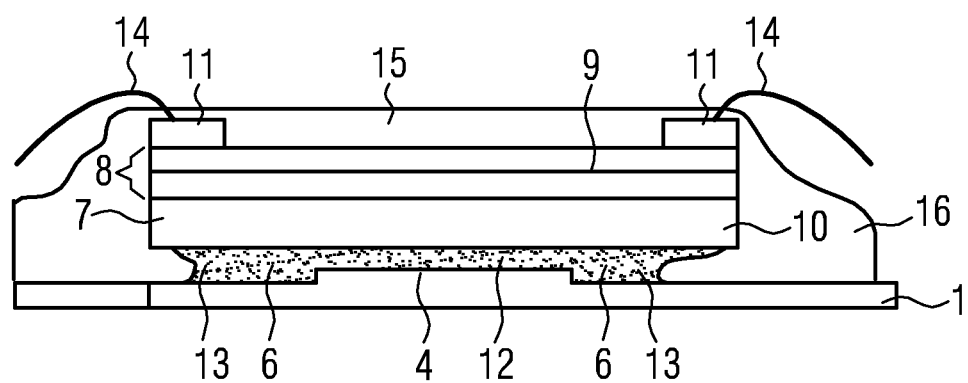

The schematic sectional views of FIGS. 12 and 13 each show an optoelectronic component according to an execution example.

Same, similar or similarly acting elements are provided in the Figures with the same reference signs. The Figures and the proportions of the elements depicted in the Figures are not to be regarded as true to scale. Rather, individual elements, in particular layer thicknesses, can be exaggeratedly large for better representability and/or better understanding.

DETAILED DESCRIPTION OF ILLUSTRATIVE EMBODIMENTS

Figure 1:
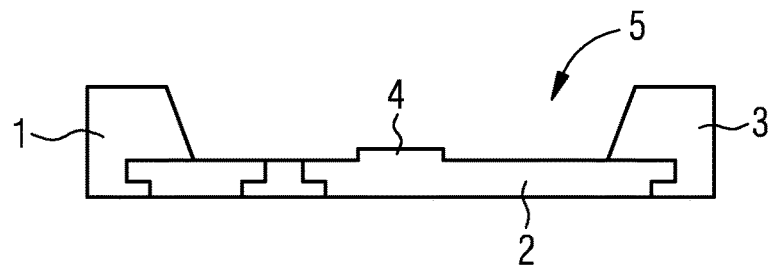

In the method according to the execution example of FIGS. 1 to 7, a carrier 1 is provided in a first step (FIG. 1). At present, the carrier 1 comprises a metallic lead frame 2 and a housing body 3. The lead frame 2 is inserted into the housing body 3 and in places forms a surface of the carrier 1. The lead frame 2 has a pedestal 4 with a supporting surface. The housing body 3 forms a cavity 5 with a bottom surface, whereby the bottom surface of the cavity 5 is formed in places by the surface of the lead frame 2. Furthermore, pedestal 4 in cavity 5 is freely accessible from the outside.

Figure 2:
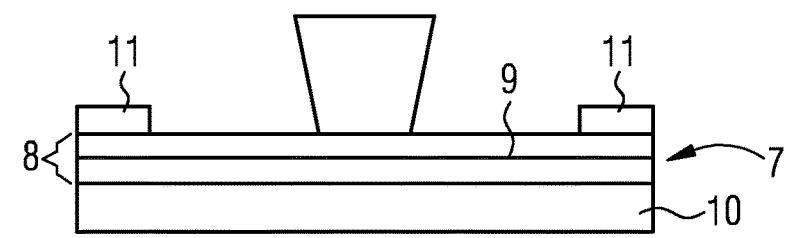

The next step a drop of liquid jointing material 6 is applied to the support surface of the pedestal 4. At present, the jointing material 6 has reflective filler particles. The liquid joining material 6 completely wets the supporting surface, while the side surfaces of the pedestal 4 and the remaining surface of the carrier 1 are free of the joining material 6. Then a radiation emitting semiconductor chip 7, for example in a pick-and-place process, is positioned above the pedestal 4 with the joining material 6 (FIG. 2).

The semiconductor chip 7 has an epitaxial semiconductor layer sequence 8 with an active zone 9 that is configured to generate blue light. The epitaxial semiconductor layer sequence 8 is grown epitaxially on a first main surface of a substrate 10. The substrate is a sapphire substrate that is transparent to the blue light of the active zone 9. The first main surface of the substrate 10 is opposed by a second main surface of the substrate 10, which forms the mounting surface of the semiconductor chip 7. The semiconductor chip 7 emits the light generated by the active zone 9 via its radiation exit surface, which is opposite the mounting surface. Furthermore, the semiconductor chip 7 comprises two front electrical contacts 11.

Figure 3:
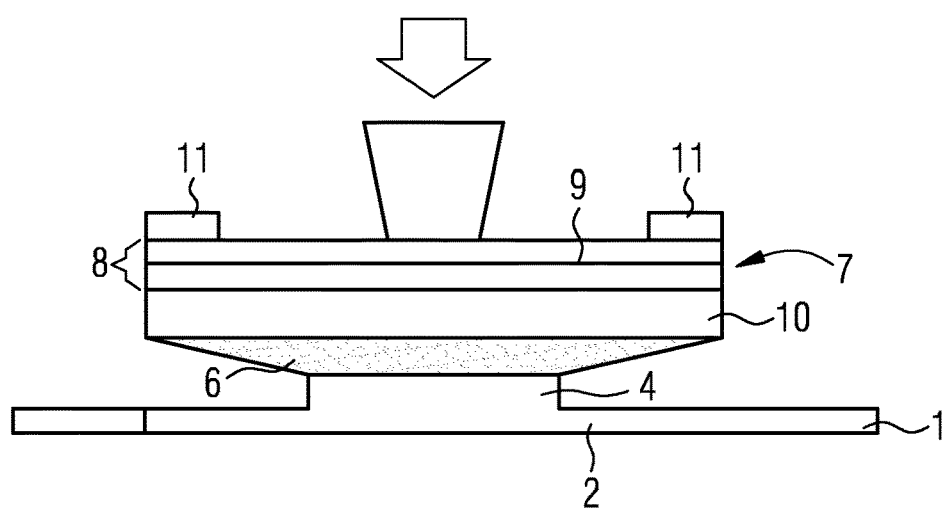

In a next step, the semiconductor chip 7 is lowered onto the joining material 6 so that the joining material 6 completely wets the mounting surface of the semiconductor chip 7 in addition to the contact surface of the pedestal 4 (FIG. 3).

Filler particles have been introduced into the joining material 6 at present. The joining material 6, for example, is a silicone. In this execution example, the filler particles are embodied reflective. For example, the filler particles are titanium dioxide particles.

Figure 4:
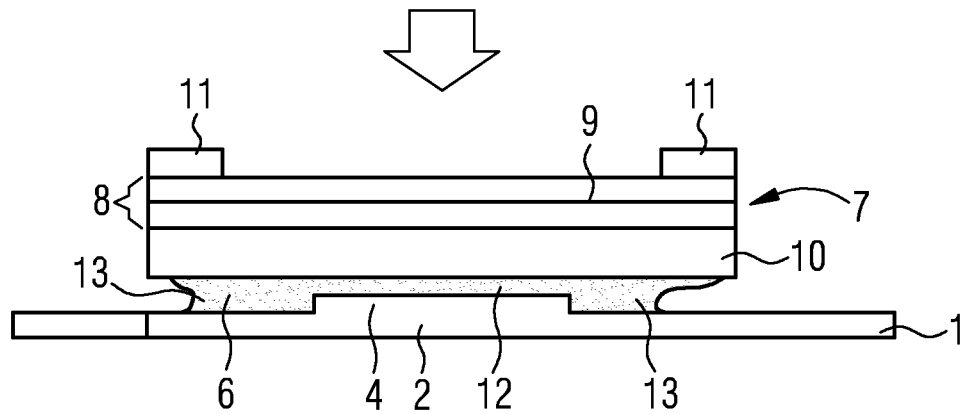
Figure 5:
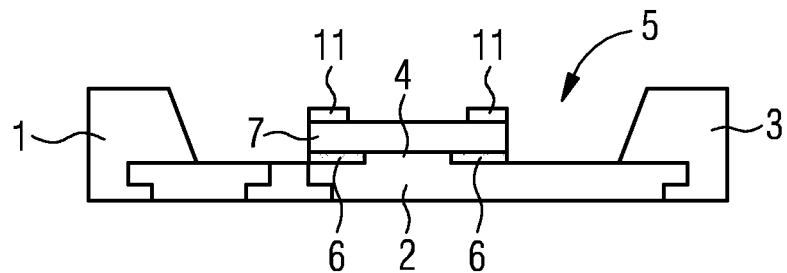

In a next step, which is schematically shown in FIG. 4, the radiation emitting semiconductor chip 7 is lowered onto the pedestal 4 in such a way that a joining layer 12 of joining material 6 is formed between the contact surface of the pedestal 4 and the mounting surface of the semiconductor chip 7. Furthermore, the joining material 6 partially fills a recess 13, which is limited by the part of the mounting surface projecting over the contact surface. The recess 13 is further delimited by the side surfaces of the pedestal 4 and parts of the surface of the carrier 1, which are protruded by the semiconductor chip 7. At present, only the recess 13 is partially filled with the joining material 6, while the rest of the surface, which is not protruded by the semiconductor chip 7, remains free of the joining material 6. The side surfaces of the semiconductor chip 7 are also advantageously free of the joining material 6. Then the joining material 6 is cured so that a mechanically stable joining layer 12, which establishes a material-locking connection between the support surface of the pedestal 4 and the mounting surface of the semiconductor chip 7, is obtained. Furthermore, during curing a mechanically stable, reflective underfill of the semiconductor chip 7 is created from the cured joining material in the recess 13 (FIG. 5).

Figure 6:
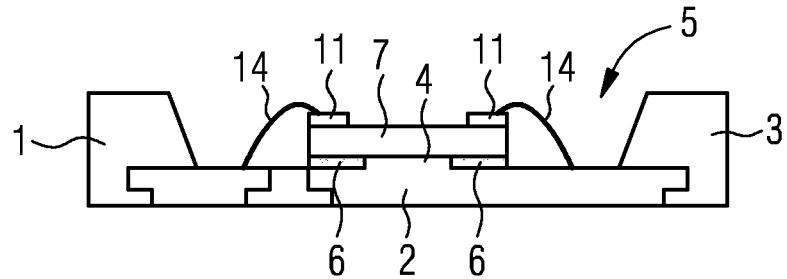

In a next step, which is schematically shown in FIG. 6, the semiconductor chip 7 is electrically contacted, in which two electrical contacts 11 of the semiconductor chip 7, which are arranged on a front side of the semiconductor chip 7, are electrically conductively connected to electrical connection points of the lead frame 2 by a bonding wire 14 (FIG. 6). The front side of the semiconductor chip 7 is opposite the mounting surface of the semiconductor chip 7.

Then the recess 13 of the housing body 3 is filled with a casting 15, in which phosphor particles are introduced. The phosphor particles are configured to convert blue light of the semiconductor chip 7 into yellow light.

Figure 7:
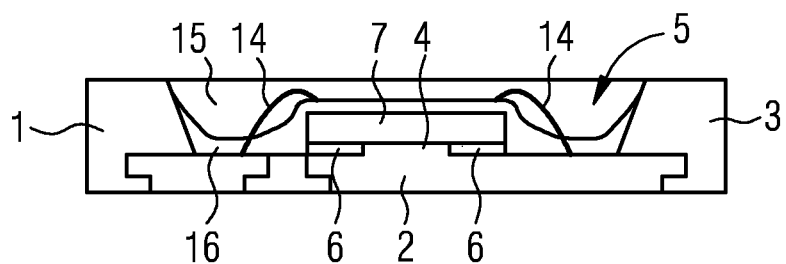

In the method described in this example, the phosphor particles sediment in the casting 15 and form a wavelength converting layer 16 on the surface of carrier 1 and on the surface of the semiconductor chip 7. The casting 15 is then cured (FIG. 7).

Figure 8:
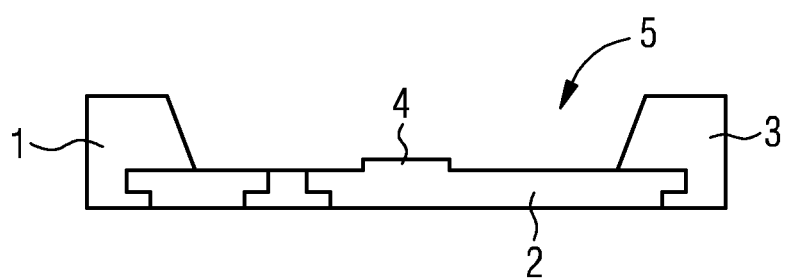

In the method described in FIGS. 8 to 11, a carrier 1 is again provided first, as already described in connection with FIG. 1 (FIG. 8).

Then the method steps are carried out as already described in connection with FIGS. 2 to 4, wherein the filler particles in the joining material 6 are not embodied reflective but wavelength converting. The filler particles are configured to convert blue light of the active zone into red light.

Figure 9:
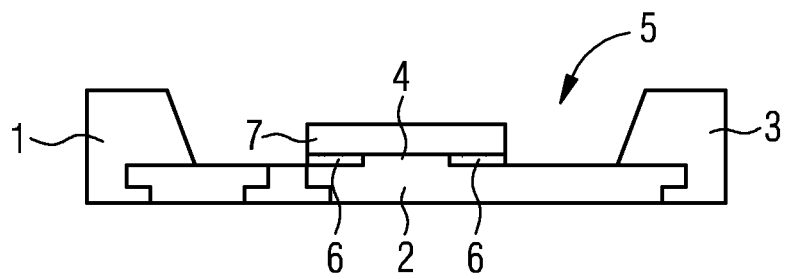

The semiconductor chip 7 is fixed mechanically stable on the contact surface of the pedestal 4 by a joining layer 12, in which wavelength converting filler particles are introduced. Furthermore, the recess 13, which is limited by the part of the mounting surface of the semiconductor chip 7 projecting over the contact surface, the side surfaces of the pedestal 4 and the surface of the carrier 1 below the semiconductor chip 7, is filled with the joining material 6, which has wavelength converting filler particles (FIG. 9). A wavelength converting underfill is thus arranged below the semiconductor chip 7.

Figure 10:
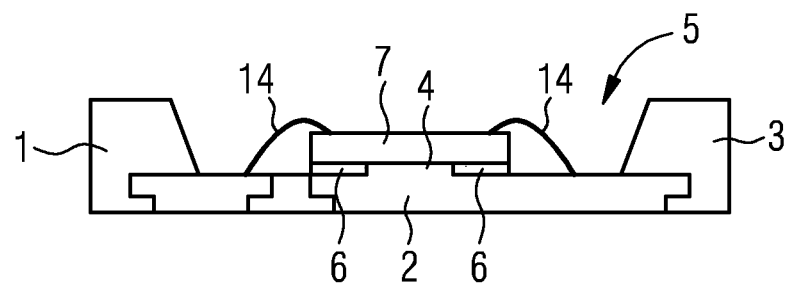

In the next step, the semiconductor chip 7 is again electrically contacted, as already described in connection with FIG. 6 (FIG. 10).

Figure 11:
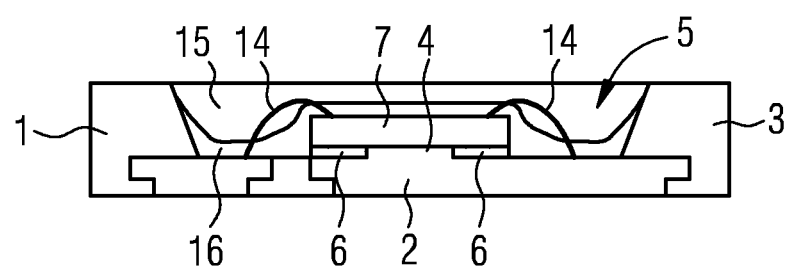

Then a wavelength converting casting 15 is again introduced into the cavity 5 of the housing body 3, which contains phosphor particles. In contrast to the execution example according to FIGS. 1 to 7, the phosphor particles are configured to convert blue light from the active zone into green light. The phosphor particles sediment in a wavelength converting layer 16 on the surface of the semiconductor chip 7. After sedimentation of the phosphor particles, the casting 15 is cured (FIG. 11).

FIG. 12 shows a section of an optoelectronic component as it can be manufactured using the method according to FIGS. 1 to 7.

The optoelectronic component according to the execution example of FIG. 12 has a carrier 1 with a pedestal 4. A semiconductor chip 7 is mounted on the support surface of the pedestal 4 with its mounting surface. The mounting surface protrudes laterally beyond the pedestal 4 and forms a recess 13 with the side surfaces of the pedestal 4 and the surface of the carrier 1, which is protruded by the semiconductor chip 7. The recess 13 is filled with an underfill of a cured joining material 6, into which reflective filler particles, such as titanium dioxide particles, are introduced. The semiconductor chip 7 is mechanically stably connected to the pedestal 4 via the joining layer 12, which is formed from cured joining material 6. The semiconductor chip 7 is electrically contacted at the front via two electrical contacts bonding wires 14.

Furthermore, the semiconductor chip 7 is surrounded by a wavelength converting layer 16, which is configured to convert blue light of the semiconductor chip 7 into yellow light. The component according to the execution example of FIG. 12 emits mixed colored light composed of unconverted blue light from the semiconductor chip 7 and yellow converted light from the wavelength converting layer 16 to white light.

FIG. 13 shows a section of an optoelectronic component as it can be manufactured using the method according to FIGS. 8 to 11.

In the case of the optoelectronic component according to the execution example of FIG. 13, the cured joining material 6 of the underfill is not filled with reflective filler particles, but with wavelength converting filler particles. The wavelength converting filler particles are configured to convert blue light of the semiconductor chip 7 into red light. Furthermore, the wavelength converting layer 16 of the component according to the execution example of FIG. 13 is provided with phosphor particles that convert blue light into green light. The component according to the execution example of FIG. 13 emits mixed colored light consisting of blue light from the semiconductor chip 7, red light from the wavelength converting filler particles and green light from the wavelength converting layer 16.

The present application claims the priority of the German application DE 102017115656.9, the disclosure content of which is hereby incorporated by reference.

The invention is not limited by the description on the basis of the execution examples to these. Rather, the invention includes each new feature as well as each combination of features, which in particular includes each combination of features in the patent claims, even if that feature or combination itself is not explicitly stated in the patent claims or execution examples.

The invention claimed is:

1. A method for manufacturing an optoelectronic component, the method comprising:
   providing a carrier having a pedestal with a support surface;
   applying a liquid joining material with filler particles to the support surface of the pedestal; and
   applying a radiation emitting semiconductor chip with a mounting surface, which is larger than the support surface of the pedestal to the joining material such that the joining material forms a joining layer between the support surface of the pedestal and the mounting surface of the semiconductor chip and the joining material at least partially fills only a recess, which is limited by a part of the mounting surface projecting beyond the support surface,
   wherein a portion of a surface of the carrier is covered with the joining material only below the mounting surface of the semiconductor chip while a remainder of the surface of the carrier remains free of the joining material, and
   wherein the filler particles are diffusively reflective at least for an electromagnetic radiation of an active zone.

2. The method according to claim 1, wherein the semiconductor chip is applied to the support surface by lowering such that the joining material completely wets the mounting surface of the semiconductor chip before filling the recess.

3. The method according to claim 1, wherein the carrier comprises a lead frame.

4. The method according to claim 1, wherein the semiconductor chip comprises an epitaxial semiconductor layer sequence having the active zone configured to generate the electromagnetic radiation of a first wavelength range and a substrate transparent for the electromagnetic radiation of the active zone.

5. The method according to claim 1, wherein the joining layer has a thickness between 1 micrometers and 5 micrometers inclusive.

6. The method according to claim 1, wherein the filler particles have a diameter between 150 nanometer and 250 nanometer inclusive.

7. The method according to claim 1,
wherein the surface of the carrier at least partially forms a bottom surface of a cavity, in which the semiconductor chip is arranged, and
wherein the cavity is filled with a casting, in which phosphor particles are introduced, which are configured to convert the radiation of a first wavelength range into radiation of a second wavelength range.

8. An optoelectronic component comprising:
a carrier comprising a pedestal having a supporting surface;
a radiation emitting semiconductor chip having a mounting surface larger than the support surface of the pedestal so that a recess is defined by a part of the mounting surface projecting beyond the support surface;
a joining layer comprising a joining material with filler particles and connecting the mounting surface of the semiconductor chip and the support surface of the pedestal to one another in a material-locking manner; and
an underfill formed from the joining material with the filler particles and arranged only in the recess while a region of a surface of the carrier, which projects beyond the mounting surface of the semiconductor chip is free of the underfill, and
wherein the filler particles are diffusively reflective at least for an electromagnetic radiation of an active zone.

9. The optoelectronic component according claim 8, wherein side surfaces of the semiconductor chip are free of the joining material.

10. The optoelectronic component according to claim 8, wherein the optoelectronic component is configured to emit warm white light.

11. The optoelectronic component according to claim 8, wherein the carrier has a single pedestal and the semiconductor chip is applied centrally to the support surface of the pedestal so that the recess is formed completely circumferentially around the pedestal.

12. The optoelectronic component according to claim 8, wherein the pedestal has a protrusion or an indentation delimited by the support surface.

13. The optoelectronic component according to claim 8,
wherein the semiconductor chip has two electrical contacts on a front side of the semiconductor chip, and
wherein the carrier has two pedestals, each pedestal is arranged below a corresponding electrical contact of the semiconductor chip.

* * * * *